United States Patent
Mungekar et al.

(10) Patent No.: US 7,678,715 B2
(45) Date of Patent: Mar. 16, 2010

(54) LOW WET ETCH RATE SILICON NITRIDE FILM

(75) Inventors: Hemant P. Mungekar, Campbell, CA (US); Jing Wu, San Jose, CA (US); Young S. Lee, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 138 days.

(21) Appl. No.: 11/962,674

(22) Filed: Dec. 21, 2007

(65) Prior Publication Data

US 2009/0163041 A1    Jun. 25, 2009

(51) Int. Cl.
*H01L 21/00* (2006.01)
*C23C 14/08* (2006.01)

(52) U.S. Cl. ...................... 438/795; 427/579
(58) Field of Classification Search .......... 438/199, 438/795; 427/579
See application file for complete search history.

(56) References Cited

U.S. PATENT DOCUMENTS

| | | | |
|---|---|---|---|
| 4,572,841 A | 2/1986 | Kaganowicz et al. |
| 4,690,746 A | 9/1987 | McInerney et al. |
| 4,737,379 A | 4/1988 | Hudgens et al. |
| 4,808,258 A | 2/1989 | Otsubo et al. |
| 4,835,005 A | 5/1989 | Hirooka et al. |
| 4,872,947 A | 10/1989 | Wang et al. |
| 4,878,994 A | 11/1989 | Jucha et al. |
| 4,890,575 A | 1/1990 | Ito et al. |
| 4,892,753 A | 1/1990 | Wang et al. |
| 4,960,488 A | 10/1990 | Law et al. |
| 5,000,113 A | 3/1991 | Wang et al. |
| 5,089,442 A | 2/1992 | Olmer |
| 5,156,881 A | 10/1992 | Okano et al. |
| 5,242,561 A | 9/1993 | Sato |
| 5,271,972 A | 12/1993 | Kwok et al. |
| 5,275,977 A | 1/1994 | Otsubo et al. |
| 5,279,865 A | 1/1994 | Chebi et al. |
| 5,302,233 A | 4/1994 | Kim et al. |
| 5,314,724 A | 5/1994 | Tsukune et al. |
| 5,319,247 A | 6/1994 | Matsuura |
| 5,362,526 A | 11/1994 | Wang et al. |

(Continued)

FOREIGN PATENT DOCUMENTS

EP    0660449 A1    6/1995

(Continued)

OTHER PUBLICATIONS

Abraham, Tom, "Reactive Facet Tapering Of Plasma Oxide For Multilevel Interconnect Applications," V-MIC Conference, IEEE, pp. 115-121, Jun. 15-16, 1987.

(Continued)

*Primary Examiner*—W. David Coleman
(74) *Attorney, Agent, or Firm*—Townsend and Townsend and Crew

(57) ABSTRACT

The present invention pertains to methods of depositing low wet etch rate silicon nitride films on substrates using high-density plasma chemical vapor deposition techniques at substrate temperatures below 600° C. The method additionally involves the maintenance of a relatively high ratio of nitrogen to silicon in the plasma and a low process pressure.

25 Claims, 7 Drawing Sheets

U.S. PATENT DOCUMENTS

| | | |
|---|---|---|
| 5,365,057 A | 11/1994 | Morley et al. |
| 5,401,350 A | 3/1995 | Patrick et al. |
| 5,403,434 A | 4/1995 | Moslehi |
| 5,416,048 A | 5/1995 | Blalock et al. |
| 5,468,342 A | 11/1995 | Nulty et al. |
| 5,507,881 A | 4/1996 | Sichanugrist et al. |
| 5,525,550 A | 6/1996 | Kato |
| 5,571,576 A | 11/1996 | Qian et al. |
| 5,589,233 A | 12/1996 | Law et al. |
| 5,593,741 A | 1/1997 | Ikeda |
| 5,599,740 A | 2/1997 | Jang et al. |
| 5,614,055 A | 3/1997 | Fairbairn et al. |
| 5,621,241 A | 4/1997 | Jain |
| 5,624,582 A | 4/1997 | Cain |
| 5,629,043 A | 5/1997 | Inaba et al. |
| 5,645,645 A | 7/1997 | Zhang et al. |
| 5,665,167 A | 9/1997 | Deguchi et al. |
| 5,669,975 A | 9/1997 | Ashtiani |
| 5,679,606 A | 10/1997 | Wang et al. |
| 5,688,357 A | 11/1997 | Hanawa |
| 5,709,757 A | 1/1998 | Hatano |
| 5,712,185 A | 1/1998 | Tsai et al. |
| 5,719,085 A | 2/1998 | Moon et al. |
| 5,753,044 A | 5/1998 | Hanawa et al. |
| 5,756,400 A | 5/1998 | Ye et al. |
| 5,767,628 A | 6/1998 | Keller et al. |
| 5,770,100 A | 6/1998 | Fukuyama et al. |
| 5,776,557 A | 7/1998 | Okano et al. |
| 5,786,039 A | 7/1998 | Brouquet |
| 5,792,261 A | 8/1998 | Hama et al. |
| 5,792,272 A | 8/1998 | Van Os et al. |
| 5,804,259 A | 9/1998 | Robles |
| 5,807,785 A | 9/1998 | Ravi |
| 5,849,455 A | 12/1998 | Ueda et al. |
| 5,850,105 A | 12/1998 | Dawson et al. |
| 5,858,876 A | 1/1999 | Chew |
| 5,869,149 A | 2/1999 | Denison et al. |
| 5,872,052 A | 2/1999 | Iyer |
| 5,872,058 A | 2/1999 | Van Cleemput et al. |
| 5,874,350 A | 2/1999 | Nakagawa |
| 5,903,106 A | 5/1999 | Young et al. |
| 5,910,342 A | 6/1999 | Hirooka et al. |
| 5,913,140 A | 6/1999 | Roche et al. |
| 5,915,190 A | 6/1999 | Pirkle |
| 5,937,323 A | 8/1999 | Orczyk et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,013,191 A | 1/2000 | Nasser-Faili et al. |
| 6,013,584 A | 1/2000 | M'Saad |
| 6,027,601 A | 2/2000 | Hanawa |
| 6,030,666 A | 2/2000 | Lam et al. |
| 6,030,881 A | 2/2000 | Papasouliotis et al. |
| 6,037,018 A | 3/2000 | Jang et al. |
| 6,039,851 A | 3/2000 | Iyer |
| 6,042,901 A | 3/2000 | Denison et al. |
| 6,059,643 A | 5/2000 | Hu et al. |
| 6,070,551 A | 6/2000 | Li et al. |
| 6,071,573 A | 6/2000 | Koemtzopoulos et al. |
| 6,074,959 A | 6/2000 | Wang et al. |
| 6,077,786 A | 6/2000 | Chakravarti et al. |
| 6,096,646 A | 8/2000 | Lee et al. |
| 6,106,678 A | 8/2000 | Shufflebotham et al. |
| 6,136,685 A | 10/2000 | Narwankar et al. |
| 6,147,009 A | 11/2000 | Grill et al. |
| 6,149,976 A | 11/2000 | Matsuki et al. |
| 6,149,986 A | 11/2000 | Shibata et al. |
| 6,167,834 B1 | 1/2001 | Wang et al. |
| 6,170,428 B1 | 1/2001 | Redeker et al. |
| 6,171,917 B1 | 1/2001 | Sun et al. |
| 6,174,808 B1 | 1/2001 | Jang et al. |
| 6,182,602 B1 | 2/2001 | Redeker et al. |
| 6,184,158 B1 | 2/2001 | Shufflebotham et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,037 B1 | 2/2001 | Terasaki et al. |
| 6,194,038 B1 | 2/2001 | Rossman |
| 6,197,705 B1 | 3/2001 | Vassiliev |
| 6,200,412 B1 | 3/2001 | Kilgore et al. |
| 6,203,863 B1 | 3/2001 | Liu et al. |
| 6,217,658 B1 | 4/2001 | Orczyk et al. |
| 6,224,950 B1 | 5/2001 | Hirata |
| 6,228,751 B1 | 5/2001 | Yamazaki et al. |
| 6,230,650 B1 | 5/2001 | Yamazaki |
| 6,232,196 B1 | 5/2001 | Raaijmakers et al. |
| 6,313,010 B1 | 11/2001 | Nag et al. |
| 6,326,064 B1 | 12/2001 | Denison et al. |
| 6,335,288 B1 | 1/2002 | Kwan et al. |
| 6,346,302 B2 | 2/2002 | Kishimoto et al. |
| 6,372,291 B1 | 4/2002 | Hua et al. |
| 6,395,150 B1 | 5/2002 | Van Cleemput et al. |
| 6,416,823 B2 | 7/2002 | Li et al. |
| 6,465,044 B1 | 10/2002 | Jain et al. |
| 6,503,843 B1 | 1/2003 | Xia et al. |
| 6,531,193 B2 | 3/2003 | Fonash et al. |
| 6,537,929 B1 | 3/2003 | Cheung et al. |
| 6,559,026 B1 | 5/2003 | Rossman et al. |
| 6,589,610 B2 | 7/2003 | Li et al. |
| 6,589,611 B1 | 7/2003 | Li et al. |
| 6,596,653 B2 | 7/2003 | Tan et al. |
| 6,596,654 B1 | 7/2003 | Bayman et al. |
| 6,607,983 B1 | 8/2003 | Chun et al. |
| 6,626,188 B2 | 9/2003 | Fitzsimmons et al. |
| 6,653,203 B1 | 11/2003 | Huang et al. |
| 6,673,722 B1 | 1/2004 | Yamazaki |
| 6,713,390 B2 | 3/2004 | M'Saad et al. |
| 7,172,792 B2 | 2/2007 | Wang et al. |
| 7,183,227 B1 | 2/2007 | Rasheed et al. |
| 2001/0028924 A1 | 10/2001 | Sherman |
| 2001/0033900 A1 | 10/2001 | M'Saad et al. |
| 2002/0187655 A1 | 12/2002 | Tan et al. |
| 2002/0192396 A1 | 12/2002 | Wang et al. |
| 2003/0056900 A1 | 3/2003 | Li et al. |
| 2003/0159656 A1 | 8/2003 | Tan et al. |
| 2003/0203637 A1 | 10/2003 | Hua et al. |
| 2003/0219540 A1 | 11/2003 | Law et al. |
| 2004/0146661 A1 | 7/2004 | Kapoor et al. |
| 2004/0166696 A1 | 8/2004 | Lee |
| 2006/0045986 A1* | 3/2006 | Hochberg et al. ........... 427/569 |
| 2006/0084236 A1 | 4/2006 | Vogt |
| 2007/0253881 A1 | 11/2007 | Maekawa et al. |

FOREIGN PATENT DOCUMENTS

| | | |
|---|---|---|
| EP | 0668608 A1 | 8/1995 |
| EP | 0697467 A1 | 2/1996 |
| EP | 0883166 A2 | 9/1998 |
| GB | 2267291 A | 12/1993 |
| JP | 2-058836 A | 2/1990 |
| JP | 7-161703 A | 6/1995 |
| JP | 7161695 | 6/1995 |
| WO | WO 97/03224 A | 1/1997 |

OTHER PUBLICATIONS

Alonso, J.C. et al., "High rate-low temperature deposition of silicon dioxide films by remote plasma enhanced chemical vapor deposition using silicon tetrachloride." Journal of Vacuum Science & Technology A: Vacuum, Surfaces, and Films, Nov. 1995, vol. 13, Issue 6, pp. 2924-2929.

Bar-Ilan et al., "A comparative study of sub-micron gap filling and planarization techniques", SPIE vol. 2636, Oct. 1995, 277-288.

Broomfield et al., "HDP Dielectric BEOL Gapfill: A Process for Manufacturing", IEEE/SEMI Advanced Semiconductor Manufacturing Conference 1996, pp. 255-258.

Conti et al., "Processing methods to fill High aspect ratio gaps without premature constriction," DUMIC Conference, Feb. 8-9, 1999, pp. 201-209.

Horiike et al., "High rate and highly selective SiO2 etching employing inductively coupled plasma and discussion on reaction kinetics", JVST A 13(3) May/Jun. 1995, pp. 801-809.

Kuo et al., "Thick SiO2 films obtained by plasma-enhanced chemical vapor deposition using hexamethyldisilazane, Carbon dioxide and hydrogen", Journal of The Electrochemical Society, 147 (7) 2000 p. 2679-2684.

Lee et al., "Low Temperature Silicon Nitride and Silicon Dioxide Film Processing by Inductively Coupled Please Chemical Vapor Deposition" JECS; 147 (4) 2000, pp. 1481-1486.

Lee, B. et al., "Dielectric Planarization Techniques for Narrow Pitch Multilevel Interconnects," V-MIC Conference, IEEE, pp. 85-92, Jun. 15-16, 1987.

Lim et al., "Gap-fill Performance and Film properties of PMD Films for the 65 nm device Technology", IEEE International Symposium on Semiconductor Manufacturing, Sep. 30-Oct. 2, 2003, p. 435-438.

Lucovsky, G. et al., "Deposition of silicon dioxide and silicon nitride plasma enhanced chemical vapor deposition," Journal of Vacuum Science & Technology, vol. 4, No. 3, May-Jun. 1986.

Meeks, Ellen et al., "Modeling Of SiO2 Deposition In High Density Plasma Reactors And Comparisons Of Model Predictions With Experimental Measurements," J. Vac. Sci. Technol. A, vol. 16, No. 2, pp. 544-563, Mar./Apr. 1998.

Musaka, Katsuyuki et al., "Single Step Gap Filling Technology for Subhalf Micron Metal Spacings On Plasma Enhanced TEOS/O2 Chemical Vapor Deposition System," Extended Abstracts of the International Conference on Solid State Devices and Materials, pp. 510-512, 1993.

Nag et al., "Comparative Evaluation of gap- fill dielectrics in shallow trench isolation for sub-0.25 micron Technologies" IEDM 1996, 841-844.

Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," Journal of Research and Development, vol. 43, 1/2 (1999).

Pai, "High quality voids free oxide deposition", Materials Chemistry and Physics, 44, 1996, pp. 1-8.

Pankov et al., "The effect of hydrogen addition on the fluorine doping level of SiO2 films prepared by remote plasma enhanced chemical vapor deposition using SiF4-based plasmas", Japanese Journal of Applied Physics part 1,37 (11) Nov. 1998, pp. 6135-6141.

Peters, "Choices and challenges for shallow trench isolation", Semiconductor International, Apr. 1999, pp. 69-76.

Qian, L. Q. et al., "High Density Plasma Deposition And Deep Submicron Gap Fill With Low Dielectric Constant SiOF Films," DUMIC Conference, ISMIC, pp. 50-56, 1995.

Takahashi et al., "The Effect of Gas-phase additives C2H4, C2H6 and C2H2 on SiH4/O2 chemical vapor deposition". Journal of the Electrochemical Society, 143 (4) Apr. 1996, pp. 1355-1361.

Takeishi et al., "Fluorocarbon films deposited by PECVD with high thermal resistance and low dielectric constants." DUMIC 1996, pp. 71-77.

Vassiliev et al., "Properties and Gap-Fill Capability of HPD-CVD Phosphosilicate Glass Films for Subquarter-Micrometer ULSI Device Technology" Electrochemical and Solid-State Letters 3 (2), 2000, pp. 80-83.

Vassiliev, "Void-free pre-metal dielectric gap- fill capability with CVD films for subquarter-micron ULSI" DUMIC, Feb. 28-29, 2000, pp. 121-132.

Vassiliev, V. Y. et al., "Trends In Void-Free Pre-Metal CVD Dielectrics," Solid State Technology, pp. 129-130, 132, 134, 136, Mar. 2001.

Xia et al., "High Aspect Ratio Trench Filling Using Two-Step Subatmospheric Chemical Vapor Deposited Borophosphosilicate Glass for <0.18 μm Device Application" JECS, 146 (5), 1999, p. 1884-1888.

Xia et al., "High Temperature Subatmospheric Chemical Vapor Deposited Undoped Silicate Glass," JECS 146 (3) 1999, pp. 1181-1185.

Yota et al., "Advanced passivation layer using high-density plasma CVD oxide for 0.25 micron CMOS Technology" DUMIC, Feb. 16-17, 1998,pp. 185-192.

Yota et al., "Extendibility of ICP high-density plasma CVD for use as intermetal dielectric and passivation layers for 0.18 micron technology," DUMIC Feb. 8-9, 1999, pp. 71-82.

Tamaoki, N., et al. "Low Temperature Solution For Silicon Nitride LPCVD Using CI-Free Inorganic Trisilylamine", *EUROCVD 14 Proceedings* (2003) Abstract #2160.

Kim, D.H., et al. "A Mechanically Enhanced Storage node for virtually unlimited Height (MESH) Capacitor Aiming at sub 70 nm DRAMs", IEDM Technical Digest (2004) pp. 69-72.

Sundaram, K.B., et al. "Wet etching studies of silicon nitride thin films deposited by electron cyclotron resonance (ECR) plasma enhanced chemical vapor deposition", *Microelectronic Engineering* (2003) 70:109-114.

Wang, Yuxiang, et al. "Dual Frequency Silicon Nitride Film of Low Thermal Budget for Pre-Metal Dielectric Applications in Sub-0. 25μm Devices", *IEEE/SEMI Advance Semiconductor Manufacturing Conference* (1999) pp. 405-408.

Park, Y.K., et al. "Effective Capacitance Enhancement Methods for 90-nm DRAM Capacitors",*Journal of the Korean Physical Society* (2004) 44(1):112-116.

PCT International Search Report and Written Opinion mailed Aug. 3, 2009; International Application No. PCT/US2008/087465, 11 pages.

* cited by examiner

LOW WET ETCH RATE SILICON NITRIDE FILM

BACKGROUND OF THE INVENTION

The present invention relates to nano-manufacturing technology solutions involving equipment, processes, and materials used in the deposition, patterning, and treatment of thin-films and coatings, with representative examples including (but not limited to) applications involving: semiconductor and dielectric materials and devices, silicon-based wafers, flat panel displays (such as TFTs), masks and filters, energy conversion and storage (such as photovoltaic cells, fuel cells, and batteries), solid state lighting (such as LEDs and OLEDs), magnetic and optical storage, micro-electro-mechanical systems (MEMS) and nano-electro-mechanical systems (NEMS), micro-optic and optoelectronic devices, architectural and automotive glasses, metallization systems for metal and polymer foils and packaging, and micro- and nano-molding. More particularly, the invention relates to the application of thin films onto a surface. Even more particularly, the invention relates a method of formation of high density thin films by chemical vapor deposition ("CVD").

Conventional thermal CVD processes supply reactive gases to the substrate surface where the heat from the surface induces chemical reactions to produce a film. Improvements in deposition rate and film properties have been achieved through the use of plasma sources to assist the chemical reactions. Plasma enhanced CVD ("PECVD") techniques promote excitation, dissociation, and ionization of the reactant gases by the application of radio frequency ("RF") energy to a reaction zone near the substrate surface, thereby creating a plasma. The high reactivity of the species in the plasma reduces the energy required to activate a chemical reaction. This effectively lowers the substrate temperature required for PECVD processes as compared to conventional thermal CVD processes. Reducing the substrate temperature is attractive because it lowers the chances of diffusion or other mass transport effects which may cause a reduction in the yield of the manufacturing process.

Further improvements have been enabled by high density plasma ("HDP") CVD techniques, in which a dense plasma is formed at low vacuum pressures so that the plasma species are even more reactive. HDP-CVD allows the use of lower partial pressures of reactant gases while maintaining a higher ionic concentration. HDP-CVD also allows the accelerating energy to be controlled independently of the ionization energy. There are a number of material changes that result from depositing films with a high density plasma in addition to distinctions associated with patterned wafer processing. When films are deposited with HDP-CVD method the resultant film may possess a higher density than other CVD methods. Denser films can be attractive as they may exhibit greater homogeneity and can be used more effectively as an etch or polishing stop layer.

A material commonly used in the fabrication of integrated devices is silicon nitride. Two common applications for silicon nitride films in the front end processing of integrated circuits include the formation of spacer structures around delicate integrated devices and the formation of contact etch stop layers, such as the barrier layer between premetal dielectric layer and the semiconductor substrate. When used as an etch stop layer, the ability of the film to exhibit a low wet etch rate "WER" during a silicon oxide etch process is desirable.

The presence of impurities within a silicon nitride film often correlates with a higher etch rate and decreased utility as an etch stop. One impurity which incorporates easily into a growing silicon nitride film is hydrogen. Growing silicon nitride with conventional thermal CVD methods has succeeded in reducing the hydrogen content to below ten percent, however, the substrate temperatures for chemical vapor deposition are in the range of 700° C. to 1000° C. The higher temperatures can degrade and even ruin material properties and devices built in earlier processing steps.

There accordingly remains a general need in the art for a method of depositing low WER silicon nitride films on substrates at reduced deposition temperatures.

BRIEF SUMMARY OF THE INVENTION

The present invention pertains to methods of depositing a high quality silicon nitride film on a substrate using a HDP-CVD process at reduced deposition temperatures. The mean substrate temperature is below or about 600° C. in some embodiments and at or below either 500° C. or 450° C. in other embodiments.

According to one embodiment of the invention, a method of depositing a silicon nitride film on a substrate disposed in a processing chamber using a HDP-CVD process comprises flowing a process gas mixture comprising nitrogen and silicon into the processing chamber while maintaining a mean ratio of the atomic-nitrogen flow to the atomic-silicon flow of about 50:1 or greater, maintaining a mean pressure in the processing chamber of about 40 mTorr or less and maintaining a mean substrate temperature of 600° C. or lower. A high density plasma is formed from the process gas to deposit the silicon nitride film over the substrate. In other embodiments the mean ratio of the atomic-nitrogen flow to the atomic-silicon flow is above or equal to 60:1 or 90:1 and the mean pressure in the processing chamber is at or below 25 mTorr, 15 mTorr, 10 mTorr or 5 mTorr. The process gas mixture may include diatomic nitrogen ($N_2$) and silane ($SiH_4$), but disilane ($Si_2H_6$) and TSA ($N(SiH_3)_3$) or other appropriate gaseous mixtures may also be used. Silicon nitride films produced with the methods of this invention may be deposited at rates greater than about 500 Å/min and the deposited films may possess wet etch rates of less than 5 Å/min when exposed to a hydrofluoric acid solution (1% HF in water).

In contrast to traditional HDP gapfill deposition processes, some embodiments of the invention apply little or no RF bias power during the deposition process and provide a deposition to sputter ratio during film growth that is greater than or equal to 50:1, 75:1 or 100:1 in different embodiments. Also, in some embodiments a flow of argon gas is introduced into the processing chamber during deposition to assist in the formation of the high density plasma. The ratio of atomic-nitrogen flow to the atomic-argon flow may be maintained between 15:1 and 15:2 and the RF power applied to create the high density plasma may be between 5 and 15 watts per square centimeter.

These and other embodiments of the invention are described below in further detail in the remaining portions of the Specification and the following drawings.

DETAILED DESCRIPTION OF THE INVENTION

The present invention relates to methods of forming high quality silicon nitride films deposited using high density plasma CVD techniques. The high quality films exhibit low WERs compared to silicon oxide when both are exposed to the same etching agent. The low WER is achieved by a reduction in hydrogen content. The hydrogen content in the silicon nitride films may be below 10% or may be below 7% in different embodiments. The low hydrogen content of silicon nitride films deposited according to techniques of the invention can be achieved while the substrate is maintained at a relatively low temperature (<600° C.) during deposition.

Many applications which benefit from a silicon nitride film with a high density, low wet (or dry) oxide etch rate, high dielectric constant, high optical index of refraction, and other related physical properties would benefit from the use of embodiments of the present invention.

A significant impurity in prior art CVD silicon nitride films is hydrogen, usually left behind from the hydrogen in the process gas mixture. A reduction in hydrogen remaining in the silicon nitride film results in an increase in the density of the film and an increase in the oxide/nitride selectivity of an oxide etch. In other words the increased density results in an increase in the ability of the silicon nitride film to resist an etch for a period of time during which regions without exposed silicon nitride continue to erode.

As an example, the manufacture of high density dynamic random access memory (DRAM) utilizes capacitors to store information. Each capacitor requires a threshold level of capacitance in order to store charge between refresh cycles. Each device shrink makes maintenance of this threshold level a challenge. One capacitor architecture involves production of tall cylinders which can be made taller to compensate for the fact that they must be made thinner in each device shrink. The shape of this type of capacitor makes it vulnerable to lateral displacements which can negatively impact yield.

Figure 1:
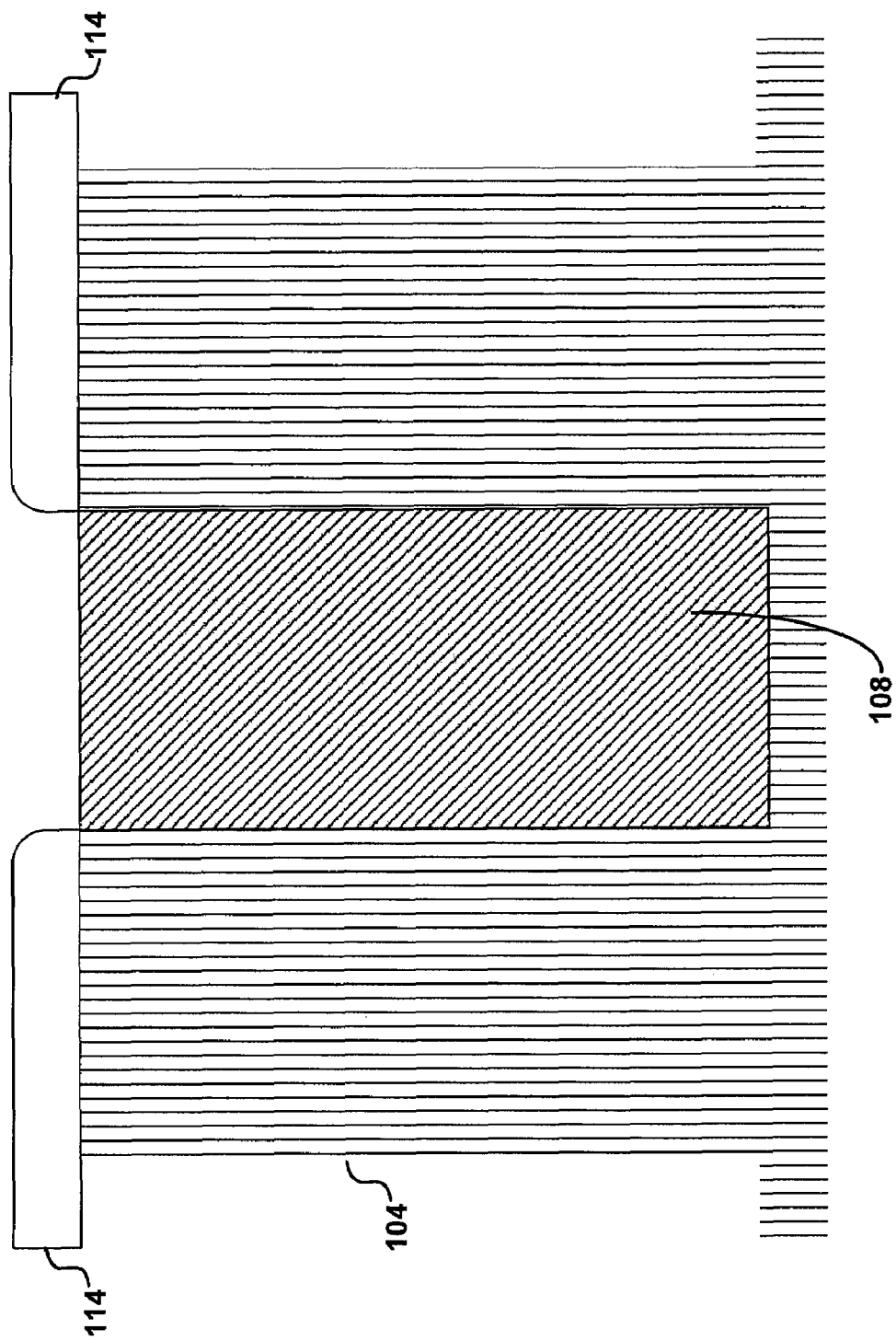
FIG. 1. is a cross-sectional view of a portion of a partially completed integrated device. The manufacturing of the device benefits from the use of low wet etch rate ("WER") silicon nitride films grown according to one embodiment of the present invention.

When metal connections are made underneath the capacitive cylinder, the process is called a capacitor over bit line ("COB") structure. Support from above can be supplied by a layer of silicon nitride as in an architecture dubbed mechanically enhanced storage node for virtually unlimited height ("MESH"). The silicon nitride MESH is used to prevent lateral displacements. FIG. 1 shows a schematic of this manufacturing method. A capacitor 104 is protected from a wet oxide etch while a silicon oxide region 108 is removed. It is desirable that the silicon nitride layer 114 be etched much slower than the silicon oxide 108 allowing the nitride layer to prevent the wet oxide etch agent from attacking the dielectric used to form the capacitor. Accordingly, the method of the present invention is useful in the manufacture of DRAM devices that utilize the structure shown in FIG. 1.

The methods and techniques of the present invention is not limited to the manufacture of DRAMs. Other etch stop layer ("ESL") applications are likely use cases including an etch stop layer placed on top of a gate material (e.g. polysilicon) or a pre-metal dielectric ("PMD"). More broadly, any application which may benefit from a low substrate deposition temperature and a film with strong resistance to an oxide etch step will benefit from embodiments of the present invention. Additionally, optical waveguides increase confinement by using a denser film of increased index of refraction. Optical applications will be particularly suitable when integration with on-chip electrical devices is desired since deposition techniques discussed herein enable a lower substrate temperature.

In embodiments, The plasma excitation is a high density plasma which may be created through inductive coupling. Other types of plasma sources may be used alone or in combination with the inductive plasma. The use of a high density plasma enables greater flexibility when choosing process gases. It is possible to use very inert gases like nitrogen as a source of nitrogen (N) in an HDP process whereas ammonia ($NH_3$) is more common as a nitrogen source in a lower density PECVD process.

As used herein, a high-density-plasma process is a plasma CVD process that employs a plasma having an ion density on the order of $10^{11}$ ions/cm$^3$ or greater and has an ionization fraction (ion/neutral ratio) on the order of $10^{-4}$ or greater. Typically HDP-CVD processes include simultaneous deposition and sputtering components. The HDP-CVD processes embodied in the present invention are somewhat different from traditional HDP-CVD processes which may be optimized for gapfill. In some embodiments, higher density silicon nitride films are achieved with substantially reduced or no bias power and thus have less sputtering than HDP-CVD processes that employ significant bias power to promote sputtering. Despite this departure from traditional HDP process parameters, a characterization involving sputtering and deposition rate will be useful and is therefore defined below.

The relative levels of the combined deposition and sputtering characteristics of a high-density plasma may depend on such factors as the gas flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(net despotion rate)} + \text{(blanket sputtering rate)}}{\text{(blanket sputtering rate)}}.$$

The deposition/sputter ratio increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{\text{(source-only deposition rate)} - \text{(net deposition rate)}}{\text{(source-only deposition rate)}},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

Typical HDP-CVD processes are geared towards the gap fill of geometries. In those processes, a bias power is used to accelerate ions toward the growth surface which produces a narrow range of approach trajectories. This narrowing combined with sputtering activity allows some gaps to be filled before the top corners of a via come together to form a void. D/S ratios in such gap fill applications are often in the range of three to ten, with some exotic applications having D/S ratios out to twenty five. An embodiment of the present invention involves the formation of high density silicon nitride films achieved using an HDP-CVD process with little or no bias power. The blanket sputtering rate under these conditions is low and difficult to measure, but the D/S ratio can generally be expected to be above about one hundred.

Figure 2:
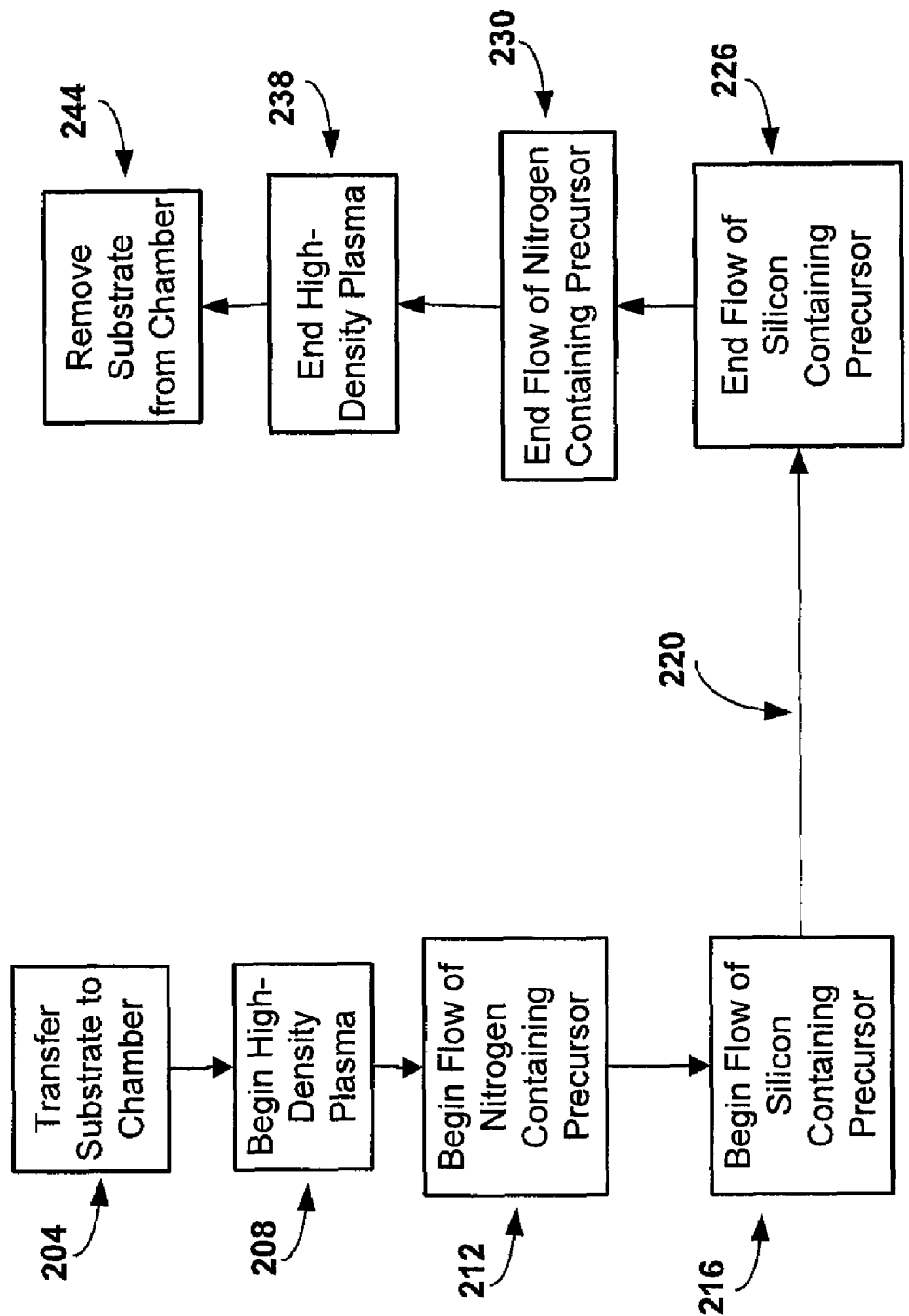
FIG. 2. is a flow chart indicating the steps involved in forming silicon nitride films with high density and high resistance to oxide etch according to one embodiment of the invention.

In order to better appreciate and understand the present invention, reference is made to FIG. 2 which is a flow chart indicating the steps involved in forming silicon nitride films with high density and high resistance to oxide etch according to one embodiment of the invention. These steps will be discussed in more detail later, but a general discussion will be included here. As shown in FIG. 2, the substrate is transferred into the process chamber (step 204) which is evacuated with vacuum pumps. Power is applied to the plasma sources (step 208) either before, after or during the initiation of gas flows (steps 212, 216) and may remain on until either before, after or during the termination of the flows (steps 226, 230). During step 212, a flow of precursor gases and a fluent gas (not indicated in FIG. 2) are delivered to the reaction region to create a process gas mixture. The process gas mixture provides a source of nitrogen and silicon which form the silicon nitride film on the substrate 220. The precursor gases may include a silicon-containing gas, such as silane ($SiH_4$), and a nitrogen (N) containing gas such as molecular nitrogen ($N_2$). Other gases can be used. Molecules comprising both silicon and nitrogen are available and can be used as one or more of the precursor gases.

Generally the silicon and nitrogen sources are introduced through different delivery channels so that they begin mixing near or in the reaction region. A fluent gas may also be introduced to facilitate the production of ionic species from the other components of the process gas mixture. For example, argon is more easily ionized than $N_2$ and, in an embodiment, can provide electrons to the plasma which then assist in the dissociation and ionization of the $N_2$. This effect increases the probability of chemical reactions and the rate of deposition. The fluent may be introduced through the same delivery channel as either or both the silicon and nitrogen sources or through a different channel altogether.

Embodiments of the invention maintain a high atomic flow ratio of nitrogen (N) to silicon (Si) in order to reduce the concentration of hydrogen in silicon nitride films. Essentially the atomic nitrogen helps to scavenge hydrogen from the growing silicon nitride network. In one embodiment, a gas flow ratio of between 25:1 and 40:1 ($N_2$:$SiH_4$), or more generally an atomic flow ratio of between 50:1 and 80:1 (N:Si), was found to minimize hydrogen content as determined by direct HFS measurements and indirect WER measurements. The present invention employs $N_2$:$SiH_4$ ratios at or above 25:1, 30:1 or 45:1 (or equivalently N:Si ratios at or above 50:1, 60:1 or 90:1) in different embodiments to minimize hydrogen incorporation.

The more general atomic flow ratio, N:Si, is calculated from the gas flow rate of each precursor gas and the total number of each atom per molecule. In the embodiment wherein one precursor is $N_2$ and another is $SiH_4$, each molecule of nitrogen includes two nitrogen atoms whereas each silane includes only one silicon atom. Using mass flow controllers to maintain a gas flow ratio above, e.g. 30:1, will result in an atomic flow ratio of above 60:1. In another embodiment, the precursor gases include at least one gas which contains both nitrogen and silicon. The atomic flow rate of all contributions are included when calculating the atomic flow ratio.

Beyond the N:Si flow ratio, minimizing hydrogen also depends on other properties of the reaction precursors. Nitrogen ($N_2$) and TSA ($N(SiH_3)_3$) are reasonable choices of precursors because the nitrogen (N) in both molecules has no direct bonds with a hydrogen atom. Having N—H bonds in the precursor gases hampers the ability of atomic nitrogen to participate in scavenging hydrogen from the growing film. Therefore, ammonia ($NH_3$) is a poor choice as a nitrogen source. Nitrogen sources containing oxygen (e.g. $N_2O$) degrade the properties of the silicon nitride film by incorporating oxygen into the network which will also raise the wet etch rate.

Maintaining a low pressure in the reaction region also helps maintain low hydrogen content. An increase in the pressure reduces the mean free path and therefore changes the ionization fraction and gas-phase dynamics, hampering the removal of the hydrogen from the silicon nitride network. The pressure in the reaction region may be at or below 40 mTorr, 25 mTorr, 15 mTorr, 10 mTorr or 5 mTorr in different embodiments.

Maintaining a low pressure at a high flow ratio necessitates the use of large pumps with throttle valves fully or almost fully open to achieve reasonable growth rates with lowest WER. The pumping capacity of the pump will depend on chamber volume and configuration along with gas flow ratio among other factors. When the invention is used in an Ultima HDP chamber manufactured by Applied Materials and outfitted for 300 mm wafers, pumping speeds greater than or equal to 2800 liter/sec may result in growth rates of 600 Å/min for optimized films. Embodiments of the present invention use the pumping configuration described in U.S. Pat. No. 7,183,227, entitled "Use of Enhanced Turbomolecular Pump for Gapfill Deposition Using High Flows of Low-Mass Fluent Gas," which is incorporated by reference herein. Higher growth rates are possible by using higher pumping speeds or allowing the WER to rise above that which is fully optimized according to embodiments of the invention.

The substrate temperature is maintained at or below 600° C., 500° C. or 450° C. in different embodiments. The RF power supplied to the top and sides of the processing chamber create the plasma in the reaction region and will be described in more detail later. The top RF power is generally less than the side RF power and the total RF power can range between 4000 watts and 10,000 watts for a 300 mm wafer (between 5 watts/cm$^2$ and 15 watts/cm$^2$). The total RF power is between about 5 watts/cm$^2$ and 15 watts/cm$^2$ or between about 5.5 watts/cm$^2$ and 10 watts/cm$^2$ in different embodiments. In an embodiment the bias RF power, which is used to accelerate ions toward the wafer, is zero or close to zero. However, many of the benefits of embodiments of the present invention will still be obtained if the bias power is turned on but maintained at a low or minimal power compared with the sum of the other RF powers allowing a deposition to sputter ratio of above about 50, 75 or 100 in different embodiments.

In one embodiment of the invention, a substrate is transferred into a deposition chamber (step 204). The plasma is started (step 208) and the nitrogen containing precursor is flowed in step 212. After steps 208 and 212, the silicon containing precursor is flowed (step 216) and film growth occurs 220. The flow of silicon containing precursor is then terminated (step 226) before the flow of nitrogen containing precursor (step 230) and the plasma is stopped (step 238). Terminating the flow of the silicon precursor prior to terminating the flow of the nitrogen precursor is desirable, in some embodiments, in order to maintain at least as high a N:Si atomic flow ratio as that which is present during film growth 220. Maintaining a high N:Si atomic flow ratio in this way avoids the production of thin layers of silicon nitride at the end of the growth process which may have a high hydrogen content and low WER. This is desirable when performing characterization steps which only probe the outer few monolayers. If the last few monolayers have different physical characteristics, incorrect inferences can be made about bulk properties. It is also desirable to maintain a low wet etch rate throughout the film to maximize the films utility as, for example, an etch-stop. In an embodiment, a substantially uniform low wet etch rate is enabled by ensuring there is sufficient nitrogen in the plasma whenever there is a silicon-containing precursor present.

In an alternate embodiment the nitrogen is flowed before the plasma is initiated. Similarly, the plasma may be stopped before the flow of the nitrogen containing precursor. Once the flow of nitrogen containing precursor and plasma are stopped, the wafer may be removed from the deposition chamber (step 244). Other steps may be present which do not appear in FIG. 2 including, but not limited to, the flow and termination of flow of a fluent gas to increase the density of the plasma. In another embodiment, the flow of an inert species may be initiated and increased and the nitrogen flow may be reduced during the time between steps 226 and 230.

Figure 3:
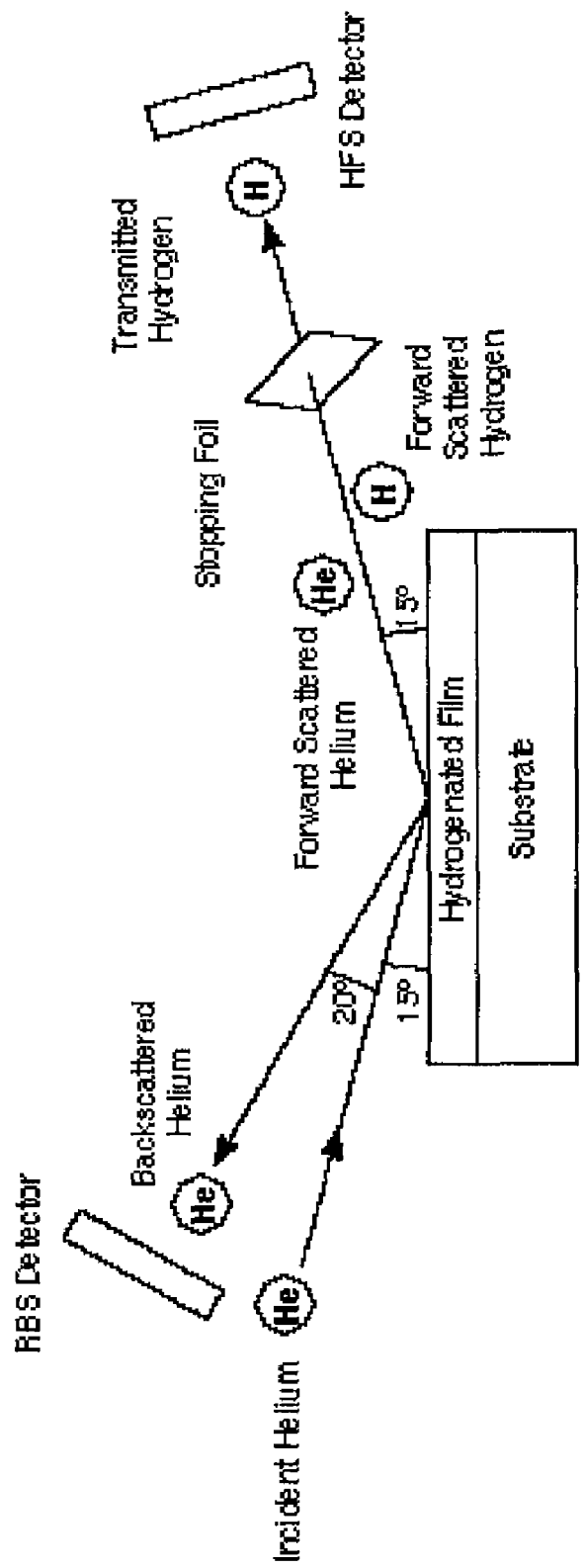
FIG. 3. is a diagram of the RBS-HFS material analysis system used to determine hydrogen content.

Hydrogen Forward Scattering spectroscopy ("HFS") and Fourier Transform Infrared spectroscopy ("FTIR") were used to quantify hydrogen content in the film as is known to those of skill in the art. HFS has greater sensitivity for small concentrations of hydrogen and is relied on more heavily. Experimental conditions are summarized in Table I. and in FIG. 3. In HFS, specularly scattered hydrogen from a deposited film under test, is quantitatively detected and compared to the results obtained using a characterized muscovite sample. The hydrogen content can then be reported as a percentage. Multiple He$^{++}$ doses were utilized to make sure the hydrogen concentration was not being reduced during a measurement. A more conventional technique, fourier transform infrared spectroscopy ("FTIR"), was also used but found to be less sensitive.

TABLE I

Experimental Conditions for Hydrogen Forward Scattering (HFS) HFS Analytical Conditions

| | |
|---|---|
| He$^{++}$ Ion Beam Energy | 2.275 MeV |
| Normal Detector Angle | 160° |
| Grazing Detector Angle | ~30° |
| Ion Beam to Sample Normal | 75° |

In order to confirm the benefits of certain embodiments of the invention, experiments were performed comparing the WER and hydrogen content of an HDP-CVD silicon nitride film deposited according to the techniques described herein to silicon nitride films deposited by PECVD and LPCVD methods. The substrate was processed in an Ultima HDP chamber outfitted for 300 mm substrates with a pumping speed of 2800 liter/sec applied during the growth of the silicon nitride film. The substrate temperature was maintained at approximately 450° C. during HDP-CVD deposition and the plasma RF powers applied were 2000 watts and 3000 watts applied at the top and side. No bias power was applied during growth. The gas flow rates were 40 sccm for silane, 1,500 sccm for nitrogen, and 300 sccm for argon.

The WER is determined in addition to the direct HFS determination of residual hydrogen content, in order to measure the chemical resistance of the film. The thickness of the silicon nitride film was measured before and after a hydrofluoric acid etch in a 1% HF solution in water. The wet etch process was sustained for a known time at 25° C. and the etch rate was calculated. Films were analyzed and results are shown in the column marked HDP in Table II below. Prior art results are shown in the other columns for comparison. The 1% HF solution etches thermally grown silicon oxide at a rate of 36 Å/min.

TABLE II

Film Characteristics vs. Deposition Techniques

| | HDP | PECVD | LPCVD |
|---|---|---|---|
| Substrate Process Temperature | 450° C. | 550° C. | 750° C. |
| WER in 1% HF | 2.1 Å/min | 20-40 Å/min | 12-14 Å/min |
| Si—H in FTIR | Not detected | Detected | Not detected |
| H % by HFS | 5% | 13% | 6-9% |

Figure 4:
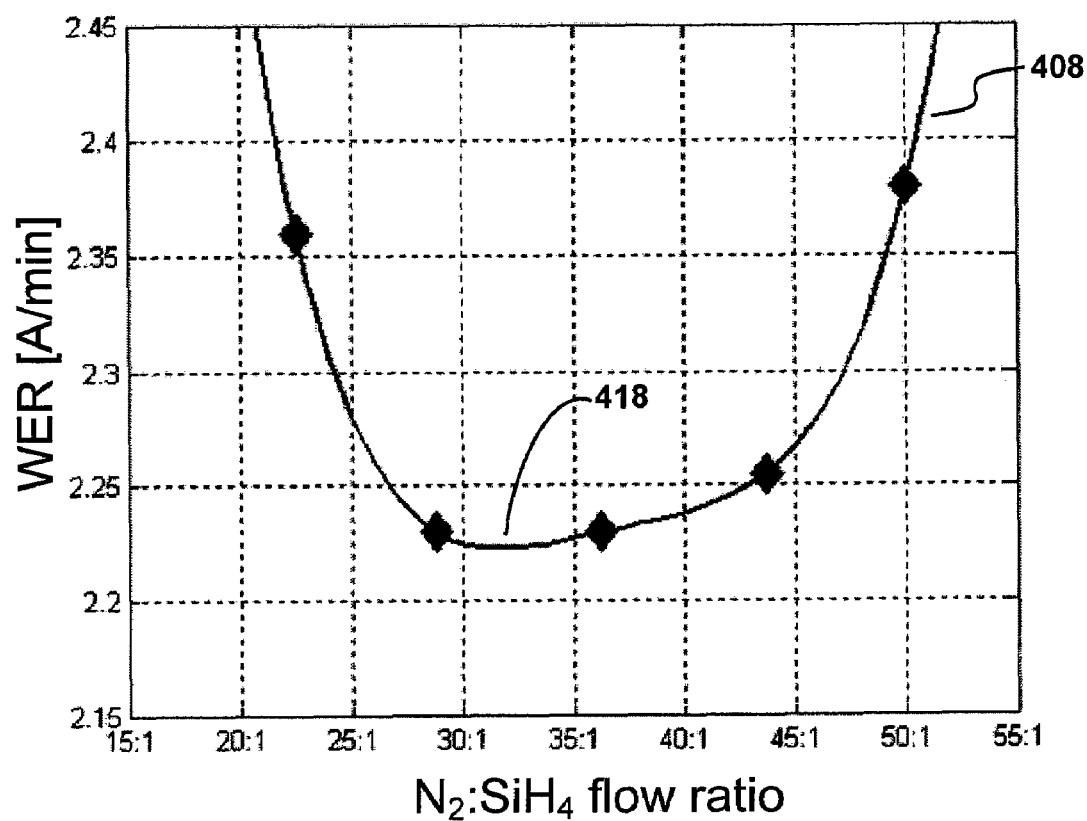
FIG. 4. is a plot of the wet etch rate of silicon nitride films grown according to embodiments with varying $N_2$:$SiH_4$ gas flow ratio.

The wet etch rate is shown in FIG. 4 as the gas flow rate of N$_2$ is varied under conditions of constant SiH$_4$ flow of 40 sccm. The wet etch rate initially is reduced for lower N$_2$ gas flow rates because the process is nitrogen limited. In this regime, additional nitrogen added to the plasma results in a more effective removal of hydrogen from the film during growth. The wet etch rate then goes through a minima and starts rising due to the increase in chamber pressure. A constant pumping rate was used during these film preparations. When the pressure rises the dynamics of the gases in the plasma are altered reducing the ability of the nitrogen to remove the hydrogen. The process shows a clear improvement in WER in the vicinity of a N$_2$:SiH$_4$ flow ratio of 25:1, going through a minimum between ratios of 25:1 and 40:1 before rising due to pumping limitations.

Different pumping rates result in a change in location of the steep rise 408 in the WER and may alter the minimum WER 418. Hypothetically, an increase in effective pumping speed from 2800 to 4000 liters/sec would move the steep rise in WER from around 50:1 to 70:1 in FIG. 4. Such a change would allow the improvement of film growth rate and/or the WER. Higher film growth rates could be achieved by increasing gas flow rate at a constant gas flow ratio. Similarly, further reduction of WER could be achieved by increasing the $N_2$:$SiH_4$ gas flow ratio at a constant silane gas flow rate.

Figure 5:
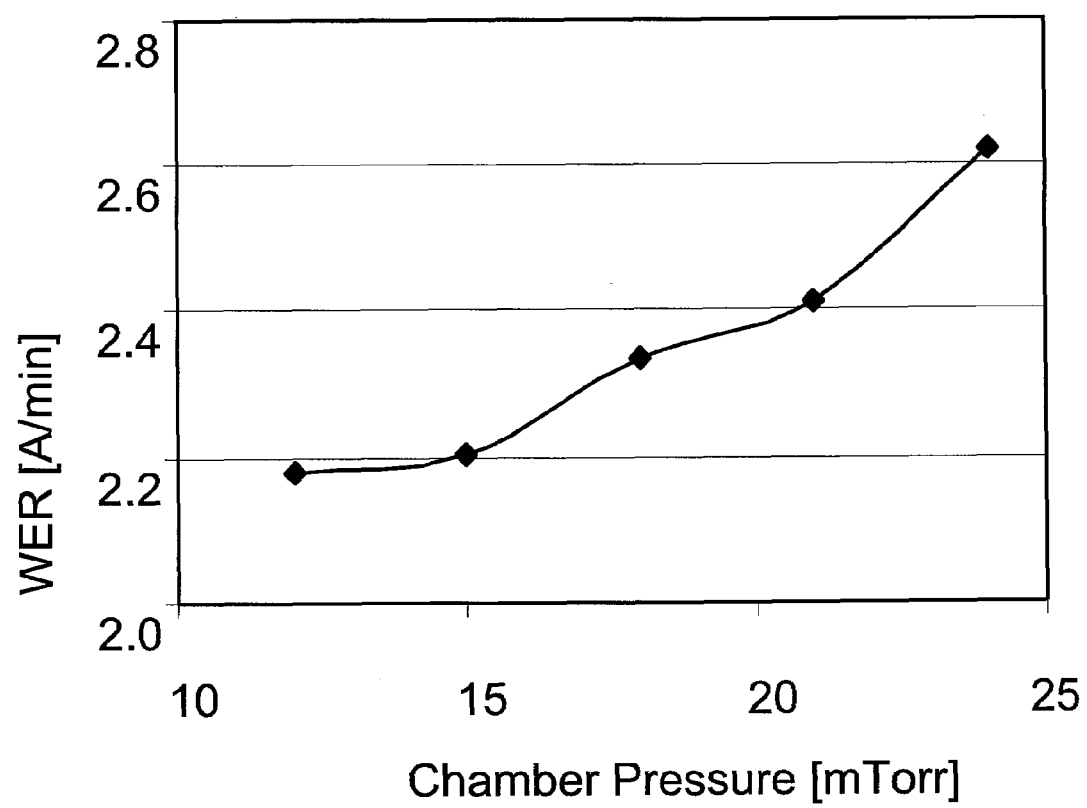
FIG. 5. is a plot of the wet etch rate of silicon nitride films grown according to embodiments with varying process chamber pressures.

The wet etch rate is shown in FIG. 5 as the chamber pressure is varied under conditions of constant $N_2$ (1,500 sccm) and $SiH_4$ (40 sccm) flow. The pressure is changed by altering the throttle valve position which, in turn, changes the effective pumping speed. The decrease in film quality (increase in wet etch rate) is clear as the chamber pressure increases for the same reason discussed with reference to FIG. 4. Film qualities are improved as the pumping speed is increased.

Exemplary Substrate Processing System

Figure 6A:
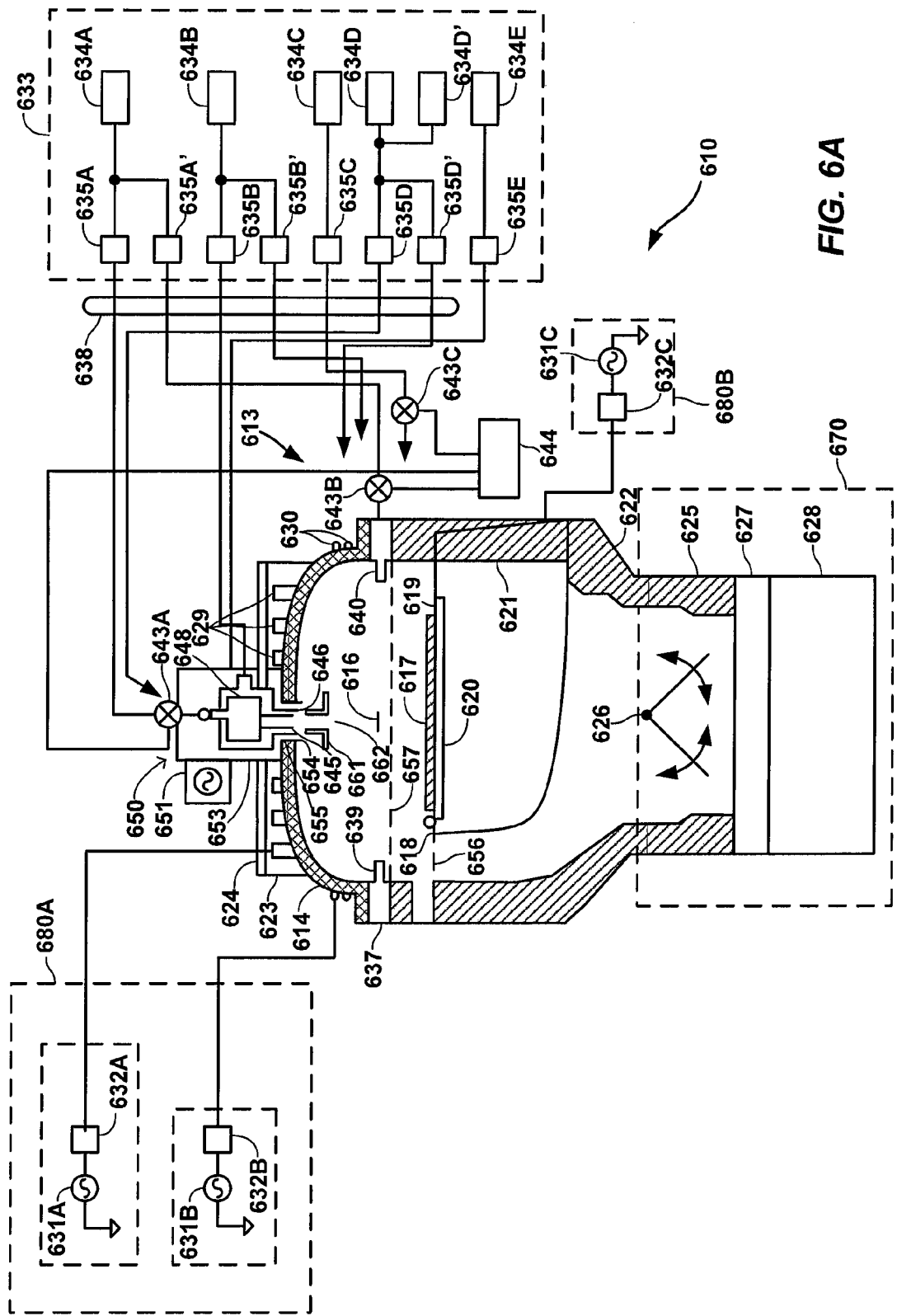
FIG. 6A is a simplified diagram of one embodiment of a high-density-plasma chemical-vapor-deposition system with which methods of the invention may be implemented.
Figure 6B:
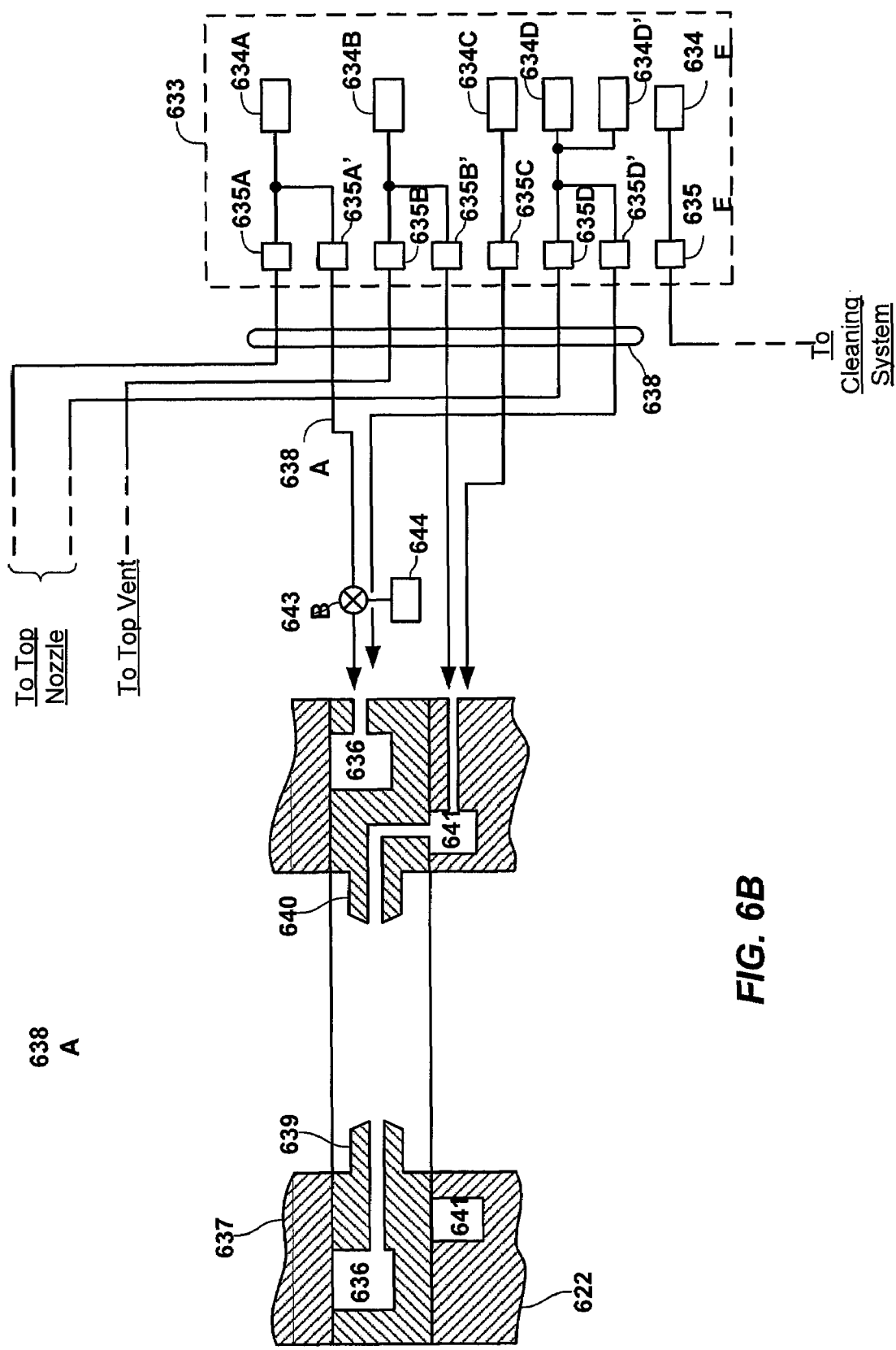
FIG. 6B is a simplified cross section of a gas ring that may be used in conjunction with the exemplary processing system of FIG. 6A.

The inventors have implemented embodiments of the invention with the ULTIMA™ system manufactured by APPLIED MATERIALS, INC., of Santa Clara, Calif., a general description of which is provided in commonly assigned U.S. Pat. No. 6,170,428, "SYMMETRIC TUNABLE INDUCTIVELY COUPLED HDP-CVD REACTOR," filed Jul. 15, 1996 by Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha, the entire disclosure of which is incorporated herein by reference. An overview of the system is provided in connection with FIGS. 6A and 6B below. FIG. 6A schematically illustrates the structure of such an HDP-CVD system 610 in one embodiment. The system 610 includes a chamber 613, a vacuum system 670, a source plasma system 680A, a bias plasma system 680B, a gas delivery system 633, and a remote plasma cleaning system 650.

The upper portion of chamber 613 includes a dome 614, which is made of a ceramic dielectric material, such as aluminum oxide or aluminum nitride. Dome 614 defines an upper boundary of a plasma processing region 616. Plasma processing region 616 is bounded on the bottom by the upper surface of a substrate 617 and a substrate support member 618.

A heater plate 623 and a cold plate 624 surmount, and are thermally coupled to, dome 614. Heater plate 623 and cold plate 624 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 613 includes a body member 622, which joins the chamber to the vacuum system. A base portion 621 of substrate support member 618 is mounted on, and forms a continuous inner surface with, body member 622. Substrates are transferred into and out of chamber 613 by a robot blade (not shown) through an insertion/removal opening (not shown) in the side of chamber 613. Lift pins (not shown) are raised and then lowered under the control of a motor (also not shown) to move the substrate from the robot blade at an upper loading position 657 to a lower processing position 656 in which the substrate is placed on a substrate receiving portion 619 of substrate support member 618. Substrate receiving portion 619 includes an electrostatic chuck 620 that secures the substrate to substrate support member 618 during substrate processing. In a preferred embodiment, substrate support member 618 is made from an aluminum oxide or aluminum ceramic material.

Vacuum system 670 includes throttle body 625, which houses twin-blade throttle valve 626 and is attached to gate valve 627 and turbo-molecular pump 628. It should be noted that throttle body 625 offers minimum obstruction to gas flow, and allows symmetric pumping. Gate valve 627 can isolate pump 628 from throttle body 625, and can also control chamber pressure by restricting the exhaust flow capacity when throttle valve 626 is fully open. The arrangement of the throttle valve, gate valve, and turbo-molecular pump allow accurate and stable control of chamber pressures up to about 1 millitorr to about 2 torr.

The source plasma system 680A includes a top coil 629 and side coil 630, mounted on dome 614. A symmetrical ground shield (not shown) reduces electrical coupling between the coils. Top coil 629 is powered by top source RF (SRF) generator 631A, whereas side coil 630 is powered by side SRF generator 631B, allowing independent power levels and frequencies of operation for each coil. This dual coil system allows control of the radial ion density in chamber 613, thereby improving plasma uniformity. Side coil 630 and top coil 629 are typically inductively driven, which does not require a complimentary electrode. In a specific embodiment, the top source RF generator 631A provides up to 2,500 watts of RF power at nominally 2 MHz and the side source RF generator 631B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 680B includes a bias RF ("BRF") generator 631C and a bias matching network 632C. The bias plasma system 680B capacitively couples substrate portion 617 to body member 622, which act as complimentary electrodes. The bias plasma system 680B serves to enhance the transport of plasma species (e.g., ions) created by the source plasma system 680A to the surface of the substrate. In a specific embodiment, bias RF generator provides up to 10,000 watts of RF power at a frequency less than 5 MHz, as discussed further below.

RF generators 631A and 631B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 632A and 632B match the output impedance of generators 631A and 631B with their respective coils 629 and 630. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 633 provides gases from several sources, 634A-634E chamber for processing the substrate via gas delivery lines 638 (only some of which are shown). As would be understood by a person of skill in the art, the actual sources used for sources 634A-634E and the actual connection of delivery lines 638 to chamber 613 varies depending on the deposition and cleaning processes executed within chamber 613. Gases are introduced into chamber 613 through a gas ring 637 and/or a top nozzle 645. FIG. 5B is a simplified, partial cross-sectional view of chamber 613 showing additional details of gas ring 637.

In one embodiment, first and second gas sources, 634A and 634B, and first and second gas flow controllers, 635A' and 635B', provide gas to ring plenum 636 in gas ring 637 via gas delivery lines 638 (only some of which are shown). Gas ring 637 has a plurality of source gas nozzles 639 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 637 has 12 source gas nozzles made from an aluminum oxide ceramic.

Gas ring 637 also has a plurality of oxidizer gas nozzles 640 (only one of which is shown), which in a preferred embodiment are co-planar with and shorter than source gas nozzles 639, and in one embodiment receive gas from body plenum 641. In some embodiments it is desirable not to mix source gases and oxidizer gases before injecting the gases into chamber 613. In other embodiments, oxidizer gas and source gas may be mixed prior to injecting the gases into chamber 613 by providing apertures (not shown) between body plenum 641 and gas ring plenum 636. In one embodiment, third, fourth, and fifth gas sources, 634C, 634D, and 634D', and third and fourth gas flow controllers, 635C and 635D', provide gas to body plenum via gas delivery lines 638. Additional valves, such as 643B (other valves not shown), may shut off gas from the flow controllers to the chamber. In implementing certain embodiments of the invention, source 634A comprises a silane $SiH_4$ source, source 634B comprises a molecular nitrogen $N_2$ source, source 634C comprises a TSA source, source 634D comprises an argon Ar source, and source 634D' comprises a disilane $Si_2H_6$ source.

In embodiments where flammable, toxic, or corrosive gases are used, it may be desirable to eliminate gas remaining in the gas delivery lines after a deposition. This may be accomplished using a 3-way valve, such as valve 643B, to isolate chamber 613 from delivery line 638A and to vent delivery line 638A to vacuum foreline 644, for example. As shown in FIG. 6A, other similar valves, such as 643A and 643C, may be incorporated on other gas delivery lines. Such three-way valves may be placed as close to chamber 613 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 6A, chamber 613 also has top nozzle 645 and top vent 646. Top nozzle 645 and top vent 646 allow independent control of top and side flows of the gases, which improves film uniformity and allows fine adjustment of the film's deposition and doping parameters. Top vent 646 is an annular opening around top nozzle 645. In one embodiment, first gas source 634A supplies source gas nozzles 639 and top nozzle 645. Source nozzle MFC 635A' controls the amount of gas delivered to source gas nozzles 639 and top nozzle MFC 635A controls the amount of gas delivered to top gas nozzle 645. Similarly, two MFCs 635B and 635B' may be used to control the flow of oxygen to both top vent 646 and oxidizer gas nozzles 640 from a single source of oxygen, such as source 634B. In some embodiments, oxygen is not supplied to the chamber from any side nozzles. The gases supplied to top nozzle 645 and top vent 646 may be kept separate prior to flowing the gases into chamber 613, or the gases may be mixed in top plenum 648 before they flow into chamber 613. Separate sources of the same gas may be used to supply various portions of the chamber.

A remote microwave-generated plasma cleaning system 650 is provided to periodically clean deposition residues from chamber components. The cleaning system includes a remote microwave generator 651 that creates a plasma from a cleaning gas source 634E (e.g., molecular fluorine, nitrogen trifluoride, other fluorocarbons or equivalents) in reactor cavity 653. The reactive species resulting from this plasma are conveyed to chamber 613 through cleaning gas feed port 654 via applicator tube 655. The materials used to contain the cleaning plasma (e.g., cavity 653 and applicator tube 655) must be resistant to attack by the plasma. The distance between reactor cavity 653 and feed port 654 should be kept as short as practical, since the concentration of desirable plasma species may decline with distance from reactor cavity 653. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 620, do not need to be covered with a dummy wafer or otherwise protected, as may be required with an in situ plasma cleaning process. In FIG. 6A, the plasma-cleaning system 650 is shown disposed above the chamber 613, although other positions may alternatively be used.

A baffle 661 may be provided proximate the top nozzle to direct flows of source gases supplied through the top nozzle into the chamber and to direct flows of remotely generated plasma. Source gases provided through top nozzle 645 are directed through a central passage 662 into the chamber, while remotely generated plasma species provided through the cleaning gas feed port 654 are directed to the sides of the chamber 613 by the baffle 661.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a silicon nitride film on a substrate disposed in a processing chamber using a HDP-CVD process comprising:

flowing a process gas mixture comprising nitrogen and silicon into the processing chamber while maintaining a mean ratio of the atomic-nitrogen flow to the atomic-silicon flow of about 50:1 or greater, maintaining a mean pressure in the processing chamber of about 40 mTorr or less and maintaining a mean substrate temperature of 600° C. or lower; and forming a high density plasma from the process gas to deposit the silicon nitride film over the substrate wherein the high density plasma has an ion density on the order of $10^{11}$ ions/cm$^3$ or greater and an ionization fraction on the order of $10^{-4}$ or greater.

2. The method of claim 1 wherein the mean ratio of the atomic-nitrogen flow to the atomic-silicon flow is about 60:1 or greater.

3. The method of claim 1 wherein the mean ratio of the atomic-nitrogen flow to the atomic-silicon flow is about 90:1 or greater.

4. The method of claim 1 wherein the mean substrate temperature is maintained at 500° C. or below.

5. The method of claim 1 wherein the mean pressure in the processing chamber is about 15 mTorr or less.

6. The method of claim 1 wherein the wet etch rate of the deposited silicon nitride film using a hydrofluoric acid solution (1% HF in water) is less than 5 Å/min.

7. The method of claim 1 wherein the growth rate of the deposited silicon nitride film is greater than about 500 Å/min.

8. The method of claim 1 further comprising flowing argon gas into the processing chamber and maintaining a ratio of atomic-nitrogen flow to the atomic-argon flow of between 15:1 and 15:2.

9. The method of claim 1 wherein the high density plasma RF power is between 5 and 15 watts per square centimeter of substrate surface.

10. The method of claim 1 wherein the high density plasma RF power is between 5.5 and 10 watts per square centimeter of substrate surface.

11. The method of claim 1 wherein the step of forming the high density plasma does not bias the plasma towards the substrate during deposition of the silicon nitride film.

12. The method of claim 1 wherein the HDP-CVD process has a deposition to sputter ratio of greater than about 50:1.

13. The method of claim 1 wherein the process gas mixture is comprised of diatomic nitrogen (N$_2$) and at least one gas from the group consisting of silane (SiH$_4$), disilane (Si$_2$H$_6$), and TSA (N(SiH$_3$)$_3$).

14. A method of depositing a silicon nitride film on a substrate disposed in a processing chamber using a HDP-CVD process comprising:

flowing diatomic nitrogen (N$_2$) with a first gas flow rate and silane (SiH$_4$) with a second gas flow rate into the processing chamber while maintaining a mean ratio of the first gas flow rate to the second gas flow rate of about 25:1 or greater maintaining a mean pressure in the processing chamber is about 40 mTorr or less and maintaining a mean substrate temperature of 600° C. or lower; and forming a high density plasma from the process gas to deposit the silicon nitride film over the substrate wherein the high density plasma has an ion density on the order of $10^{11}$ ions/cm$^3$ or greater and an ionization fraction on the order of $10^{-4}$ or greater.

15. The method of claim 14 wherein the mean ratio of the first gas flow rate to the second gas flow rate is about 30 or greater.

16. The method of claim 14 wherein the mean ratio of the first gas flow rate to the second gas flow rate is about 40 or greater.

17. The method of claim 14 wherein the mean substrate temperature is maintained at 500° C. or below.

18. The method of claim 17 wherein the mean pressure in the processing chamber is about 15 mTorr or less.

19. The method of claim 18 wherein the wet etch rate of the deposited silicon nitride film using a hydrofluoric acid solution (1% HF in water) is less than 5 Å/min.

20. The method of claim 18 wherein the growth rate of the deposited silicon nitride film is greater than about 500 Å/min.

21. The method of claim 18 further comprising flowing argon with a third gas flow rate into the processing chamber while maintaining a ratio of the first gas flow rate to the third gas flow rate of between 15:2 and 15:4.

22. The method of claim 18 wherein the high density plasma RF power is between 5 and 15 watts per square centimeter of substrate surface.

23. The method of claim 18 wherein the high density plasma RF power is between 5.5 and 10 watts per square centimeter of substrate surface.

24. The method of claim 18 wherein the step of forming the high density plasma does not bias the plasma towards the substrate during deposition of the silicon nitride film.

25. The method of claim 18 wherein the HDP-CVD process has a deposition to sputter ratio of greater than about 50.

* * * * *